(12) United States Patent
Cooke

(10) Patent No.: US 9,960,480 B2
(45) Date of Patent: May 1, 2018

(54) SOLAR ANTENNA ARRAY AND ITS FABRICATION

(75) Inventor: Laurence H. Cooke, Los Gatos, CA (US)

(73) Assignee: NovaSolix, Inc., San Jose, CA (US)

( * ) Notice: Subject to any disclaimer, the term of this patent is extended or adjusted under 35 U.S.C. 154(b) by 0 days. days.

(21) Appl. No.: 13/454,155

(22) Filed: Apr. 24, 2012

(65) Prior Publication Data

US 2013/0276861 A1 Oct. 24, 2013

(51) Int. Cl.

| H01L 31/042 | (2014.01) |
|---|---|
| H01L 31/00 | (2006.01) |
| B05D 5/12 | (2006.01) |
| H01Q 1/24 | (2006.01) |
| H01Q 21/06 | (2006.01) |
| H01L 31/09 | (2006.01) |

(52) U.S. Cl.
CPC ............. H01Q 1/248 (2013.01); H01L 31/09 (2013.01); H01Q 21/06 (2013.01)

(58) Field of Classification Search
CPC ....... H01L 31/042; H01Q 1/248; H01Q 21/06
USPC ........................................................ 136/246
See application file for complete search history.

(56) References Cited

U.S. PATENT DOCUMENTS

| 5,043,739 | A | 8/1991 | Logan et al. |
|---|---|---|---|
| 7,354,977 | B1 | 4/2008 | Woods et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 2004/0085247 | A1 | 5/2004 | Mickle et al. |
| 2007/0240757 | A1 | 10/2007 | Ren et al. |
| 2009/0128893 | A1 | 5/2009 | McCarthy et al. |
| 2010/0084475 | A1 | 4/2010 | Hata et al. |
| 2010/0244656 | A1* | 9/2010 | Ito ........................ H01Q 1/2283 313/358 |
| 2010/0263709 | A1 | 10/2010 | Norman et al. |
| 2010/0284086 | A1* | 11/2010 | Novack ................... H01Q 1/248 359/580 |
| 2011/0121258 | A1 | 5/2011 | Hanein et al. |
| 2012/0211063 | A1 | 8/2012 | Lee et al. |
| 2013/0249771 | A1* | 9/2013 | Kotter .................... H01Q 1/248 343/893 |
| 2015/0130692 | A1 | 5/2015 | Cooke |

(Continued)

FOREIGN PATENT DOCUMENTS

WO 2014063149 A1 4/2014

OTHER PUBLICATIONS

Collinear—Definition and More from the Free Merriam-Webster Dictionary, "http://www.merriam-webster.com/dictionary/collinear", 2014.*

(Continued)

*Primary Examiner* — Angelo Trivisonno
(74) *Attorney, Agent, or Firm* — Panitch Schwarze Belisario & Nadel LLP

(57) ABSTRACT

A solar antenna array may comprise an array of antennas that may capture and convert sunlight into electrical power. Methods for constructing the solar antenna array may use a stencil and self aligning semiconductor processing steps to minimize cost. Designs may be optimized for capturing a broad spectrum of visible light and non-polarized light. Testing and disconnecting, defective antennas from the array may also be performed.

14 Claims, 16 Drawing Sheets

(56) References Cited

U.S. PATENT DOCUMENTS

2015/0155396 A1 6/2015 Cooke et al.
2015/0243817 A1 8/2015 Cooke et al.
2016/0027949 A1 1/2016 Cooke et al.

OTHER PUBLICATIONS

Rows—Definition and More from the Free Merriam-Webster Dictionary, "http://www.merriam-webster.com/dictionary/rows", 2014.*
"Type—definition of type by the Free Dictionary", retrieved from <http://www.thefreedictionary.com/type> on Mar. 9, 2015.*
Siciliano et al., "Nano-Rectenna for High Efficiency Direct Conversion of Sunlight to Electricity," presented at 17th World Micromachine Summit, Apr. 26-29, 2011.
Office Action dated May 4, 2017 in U.S. Appl. No. 15/249,953, by Cooke.
Office Action dated Apr. 20, 2017 in U.S. Appl. No. 14/871,958, by Cooke.
Office Action dated Mar. 7, 2017 in U.S. Appl. No. 14/701,765, by Cooke.
Office Action dated Apr. 5, 2017 in U.S. Appl. No. 14/582,747 by Cooke.
Int'l Search Report and Written Opinion dated Aug. 11, 2016 in Int'l Application No. PCT/US16/29336.
Int'l Search Report and Written Opinion dated Apr. 8, 2016 in Int'l Application No. PCT/US15/59852.
Int'l Search Report and Written Opinion dated Jun. 20, 2017 in Int'l Application No. PCT/US2017/026130.
Office Action dated Jun. 8, 2017 in U.S. Appl. No. 14/701,765, by Cooke.
Office Action dated Nov. 14, 2016 in U.S. Appl. No. 14/582,747, by Cooke.
Office Action dated Dec. 29, 2016 in U.S. Appl. No. 15/133,807, by Cooke et al.
Int'l Preliminary Report dated Jul. 6, 2017 in PCT Application No. PCT/US2015/059852.
Office Action dated Jul. 3, 2017 in U.S. Appl. No. 15/133,807, by Cooke.
Office Action dated Jul. 27, 2017 in U.S. Appl. No. 15/411,396, by Cooke.
Office Action dated Feb. 27, 2018 in U.S. Appl. No. 15/411,396, by Cooke.
Office Action dated Mar. 9, 2018 in U.S. Appl. No. 15/133,807, by Cooke.
Int'l Preliminary Report on Patentability dated Nov. 16, 2017 in Int'l Application No. PCT/US2016/029336.
Office Action dated Jan. 11, 2018 in U.S. Appl. No. 15/249,953, by Cooke.

* cited by examiner

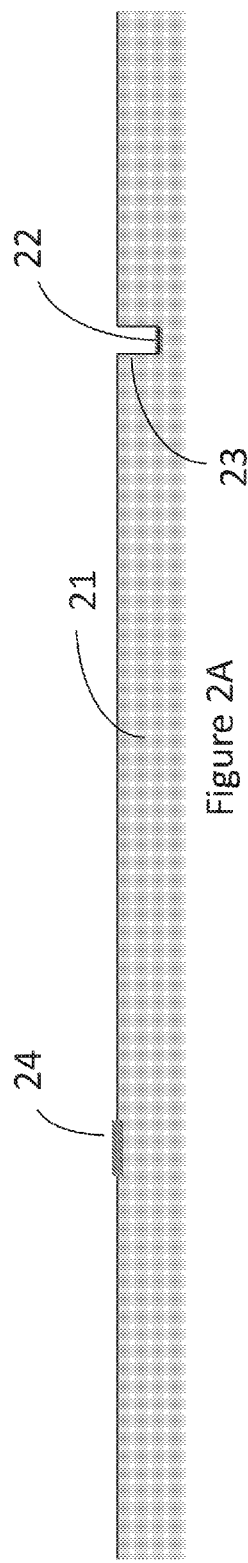
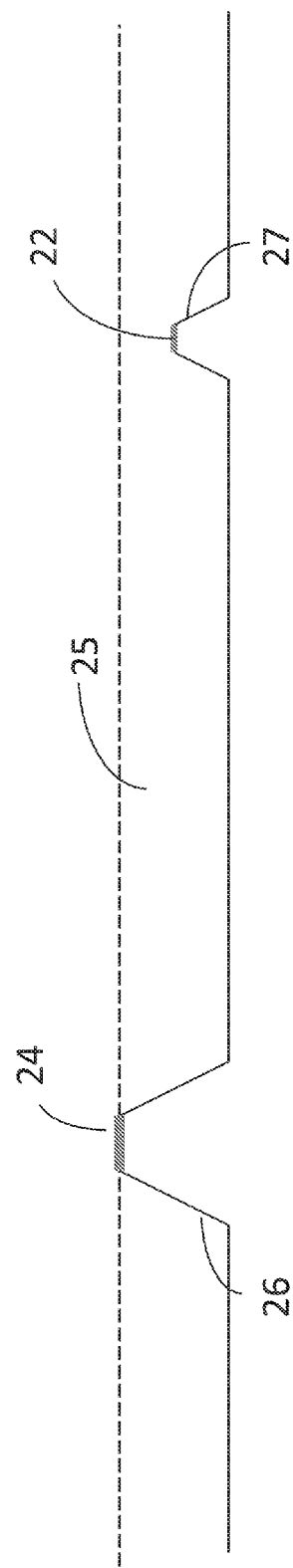
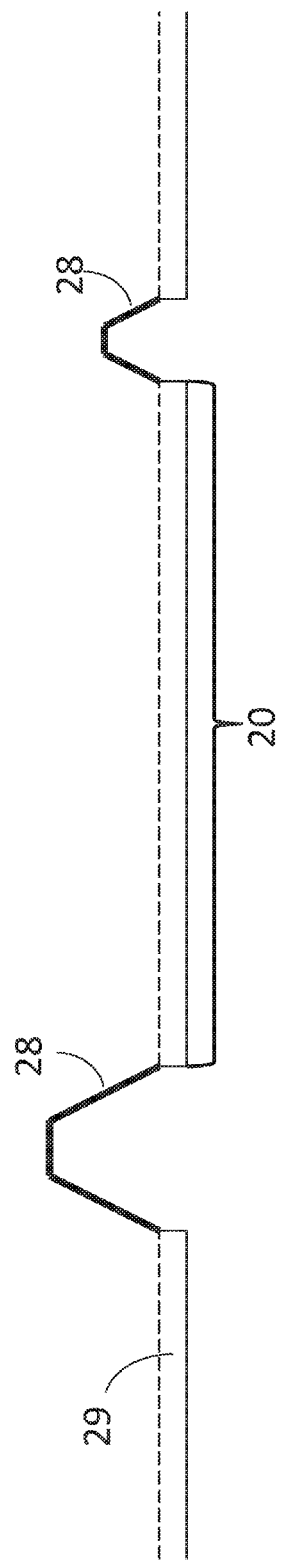
Figure 2A
Figure 2B
Figure 2C

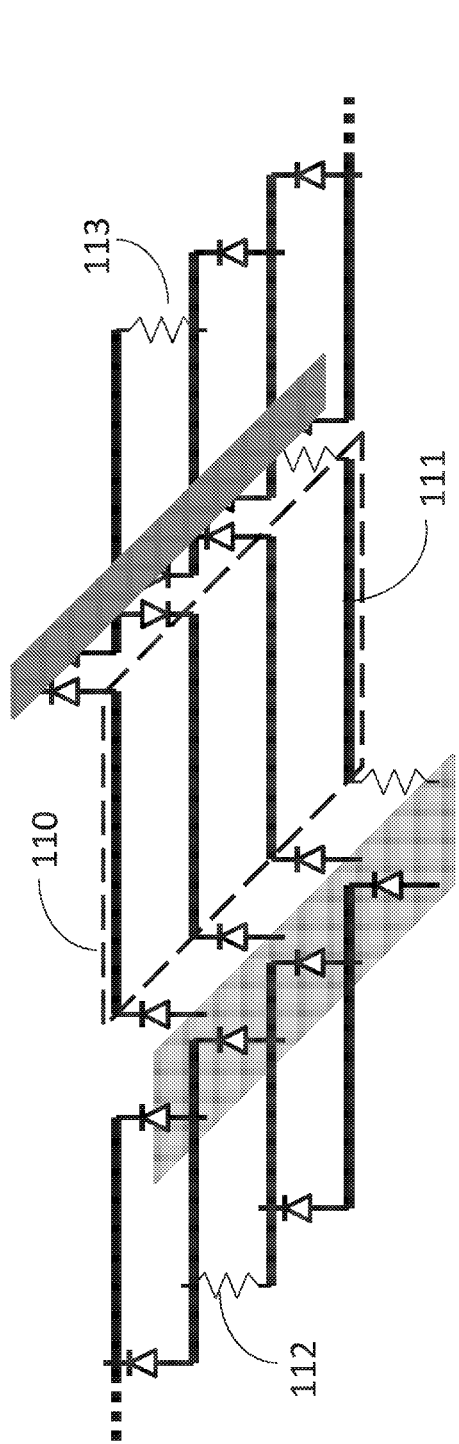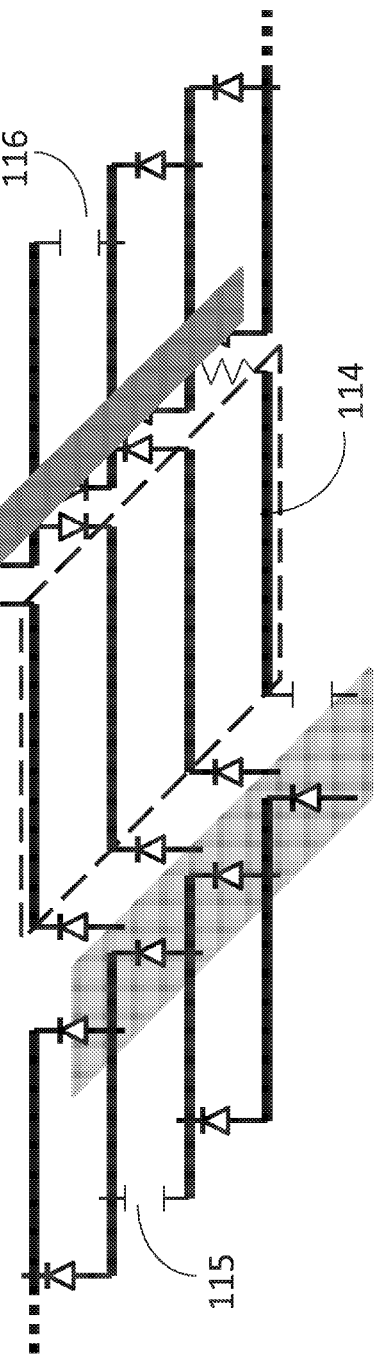
Figure 11A
Figure 11B

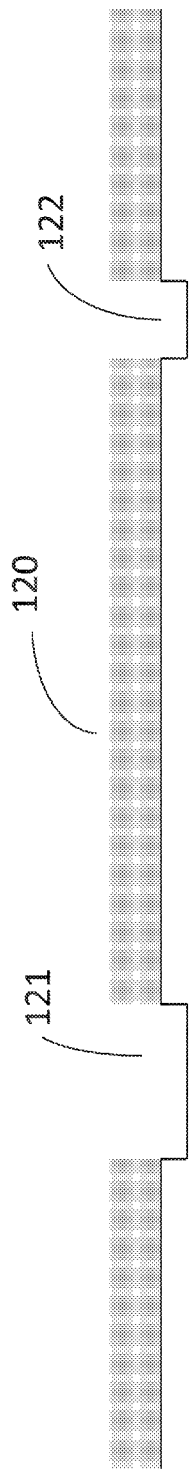
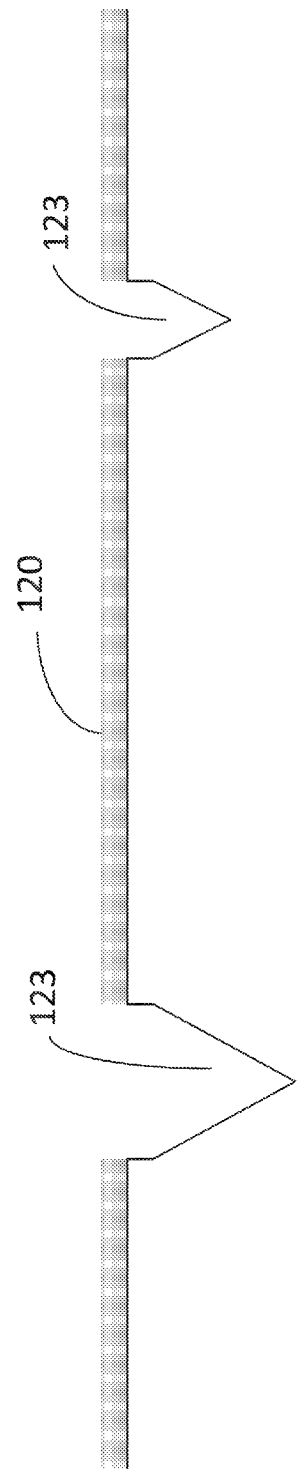
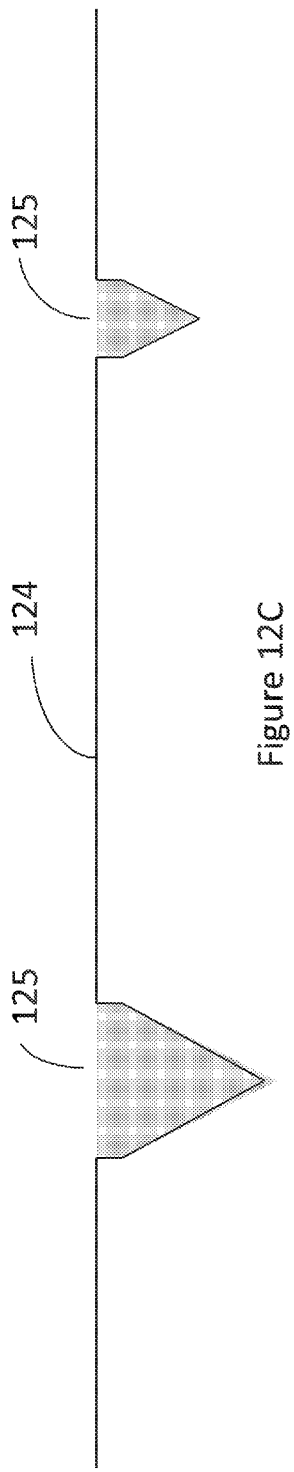
Figure 12A
Figure 12B
Figure 12C

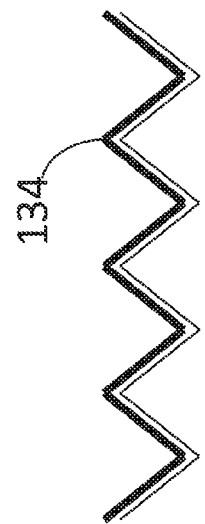
Figure 13C
Figure 13D
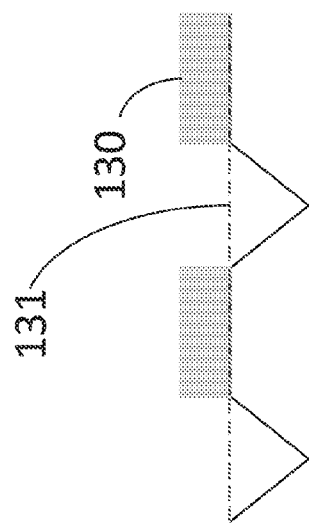
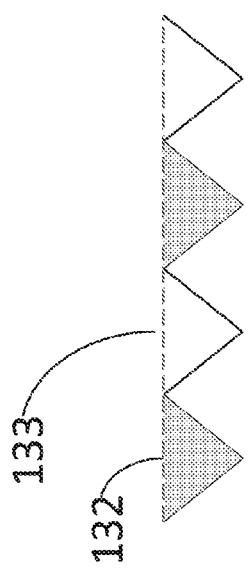
Figure 13A
Figure 13B

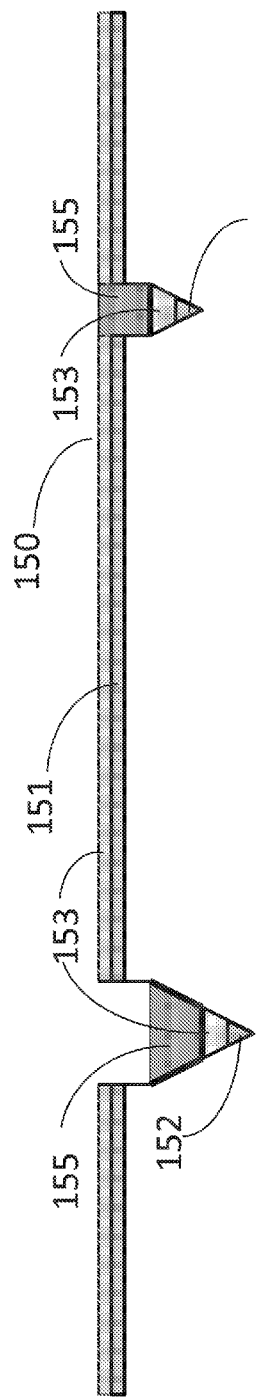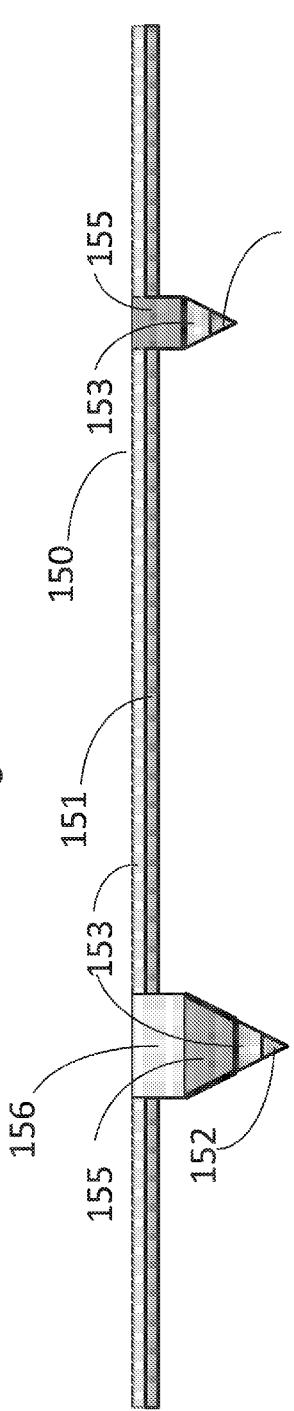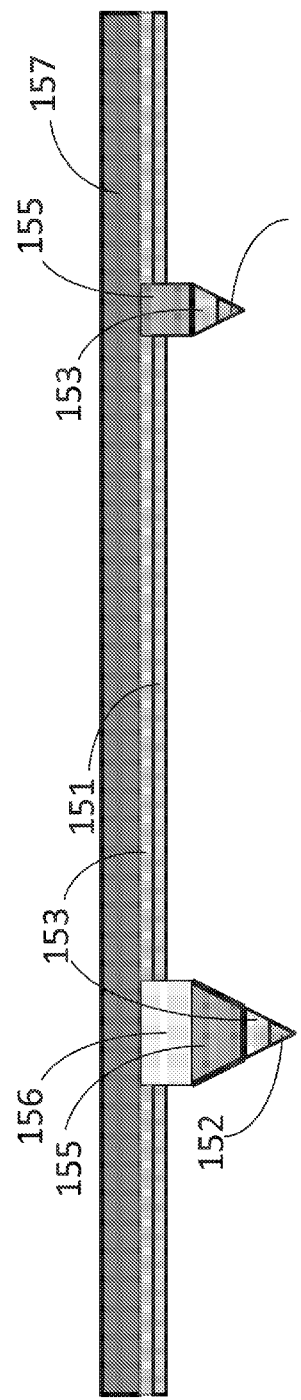

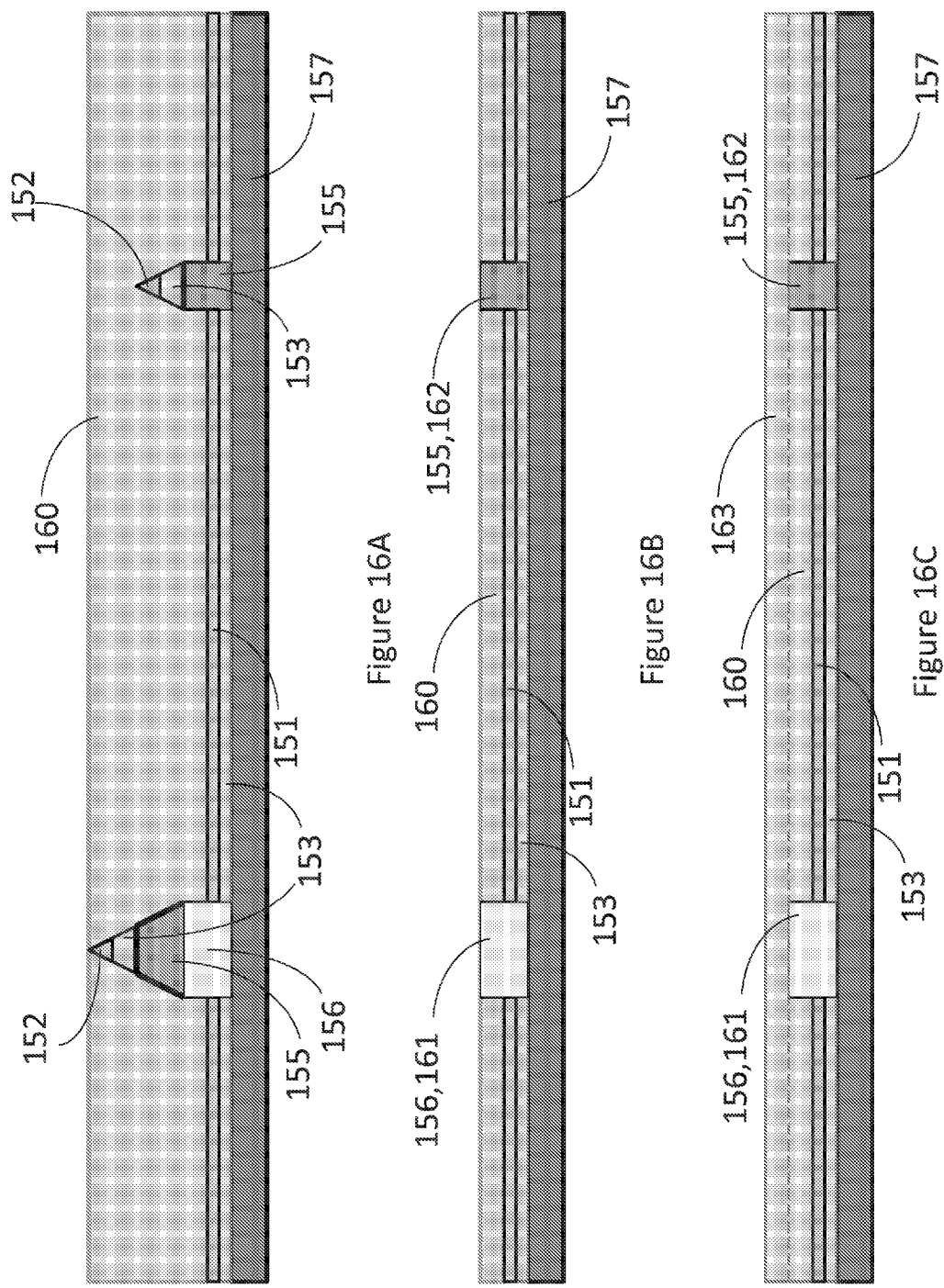

SOLAR ANTENNA ARRAY AND ITS FABRICATION

FIELD OF THE INVENTION

The present invention pertains to an economical manufacturing process of visible light rectenna arrays for the conversion of solar energy to electricity.

BACKGROUND OF THE INVENTION

Rectifiers for AC to DC conversion of high frequency signals have been well known for decades. A particular type of diode rectifier when coupled to an antenna, called a Rectenna, has also been known for decades. More specifically, over 20 years ago, Logan described using an array of Rectennas to capture and convert microwaves into electrical energy in U.S. Pat. No. 5,043,739 granted Aug. 27, 1991. However, the dimensions of the antenna limited the frequency until recently, when Gritz, in U.S. Pat. No. 7,679,057 granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity: by Pietro Siciliano of The-Institute for Microelectronics and Microsystems IMM-CNR, Leece (Italy).

Still, the minimum dimensions required for such visible light rectennas are generally in the tens of nanometers. While these dimensions can be accomplished by today's deep submicron masking technology, such processing is typically far more expensive than the current solar cell processes, which require much larger dimensions.

Still, as Logan pointed out in U.S. Pat. No. 5,043,739, the efficiency of microwave Rectennas can be as high as 40%, more than double that of typical single-junction poly-silicon solar cell arrays, and when using metal-oxide-metal (MOM) rectifying diodes, as Pietro suggests, no semiconductor transistors are needed in the array core.

As such, it may be advantageous to be able to utilize the existing fine geometry processing capability of current semiconductor fabrication without incurring the cost of such manufacturing.

SUMMARY OF EMBODIMENTS OF THE INVENTION

Various embodiments of the invention may relate to structures of rectenna arrays for converting sunlight into electricity and/or to ways to manufacture such structures, which may utilize self-aligning process steps and stencils made using current deep submicron IC masking techniques to achieve the fine dimensions required for the antennas.

The structure of the rectenna array may include an array of antennas connected to positive and negative rails by MOM diodes. The antennas may be of equal length, centered for maximum reception of green light.

In one embodiment, the rows of antennas may incrementally vary in length back and forth across the array between optimal reception of blue light and optimal reception of red light. Such optimal reception may consist of half-wavelength antennas that may vary from 220 nanometers to 340 nanometers in length. The rectenna array may be attached to a solid back surface, which may include a mirror for reflecting the light back to the array. It may also act as a ground plane, where the distance between the ground and antenna array in conjunction with the dielectric constant of the polymer between them may form an ideal strip-line antenna for visible light.

In another embodiment, a pair of arrays may be sandwiched together such that the respective layers of antenna are perpendicular to each other.

In one embodiment, a stencil may be created by a series of masked anisotropic V-groove etches with subsequent anti-adhesion depositions. A step of the process may include polishing the resist to allow the non-grooved portion of the silicon to be V-groove etched.

In another embodiment, the rectenna array may be fabricated using the stencil in successive metal deposition steps. The stencil may be angled or flat when used as a deposition target, and the deposition may be much less than the depth of the V-grooves in the stencil. The resulting metal may be peeled off the stencil using a polymer backing material. Additional layers may then be deposited on the polymer backed rectenna array.

In yet another embodiment the stencil may be repeatedly cleaned and reused.

In yet another embodiment the rectenna array may have redundant antennas, which if defective, may be disconnected by applying electricity through the array.

BRIEF DESCRIPTION OF THE DRAWINGS

Various embodiments of the invention will now be described in connection with the attached drawings, in which:

FIGS. 2A, 2B and 2C are cross-sections of a stencil in the Y direction during its fabrication, according to an embodiment of the invention, FIGS. 11A and 11B are logical diagrams of an antenna array with defects before and after testing, according to an embodiment of the invention, FIGS. 12A, 12B, and 12C are cross-sections of a stencil in the Y direction during its fabrication, according to an embodiment of the invention, FIGS. 13A, 13B, 13C and 13D are cross-sections of a stencil in the X direction during its fabrication, according to an embodiment of the invention, FIGS. 15A through 15F are cross-sections of an antenna array during fabrication on the stencil, according to an embodiment of the invention, and FIGS. 16A, 16B and 16C are cross-sections of an antenna array during its fabrication after removal from the stencil, according to an embodiment of the invention.

DESCRIPTION OF VARIOUS EMBODIMENTS

Embodiments of the present invention are now described with reference to FIGS. 1-16, it being appreciated that the figures may illustrate the subject matter of various embodiments and may not be to scale or to measure.

Figure 1:
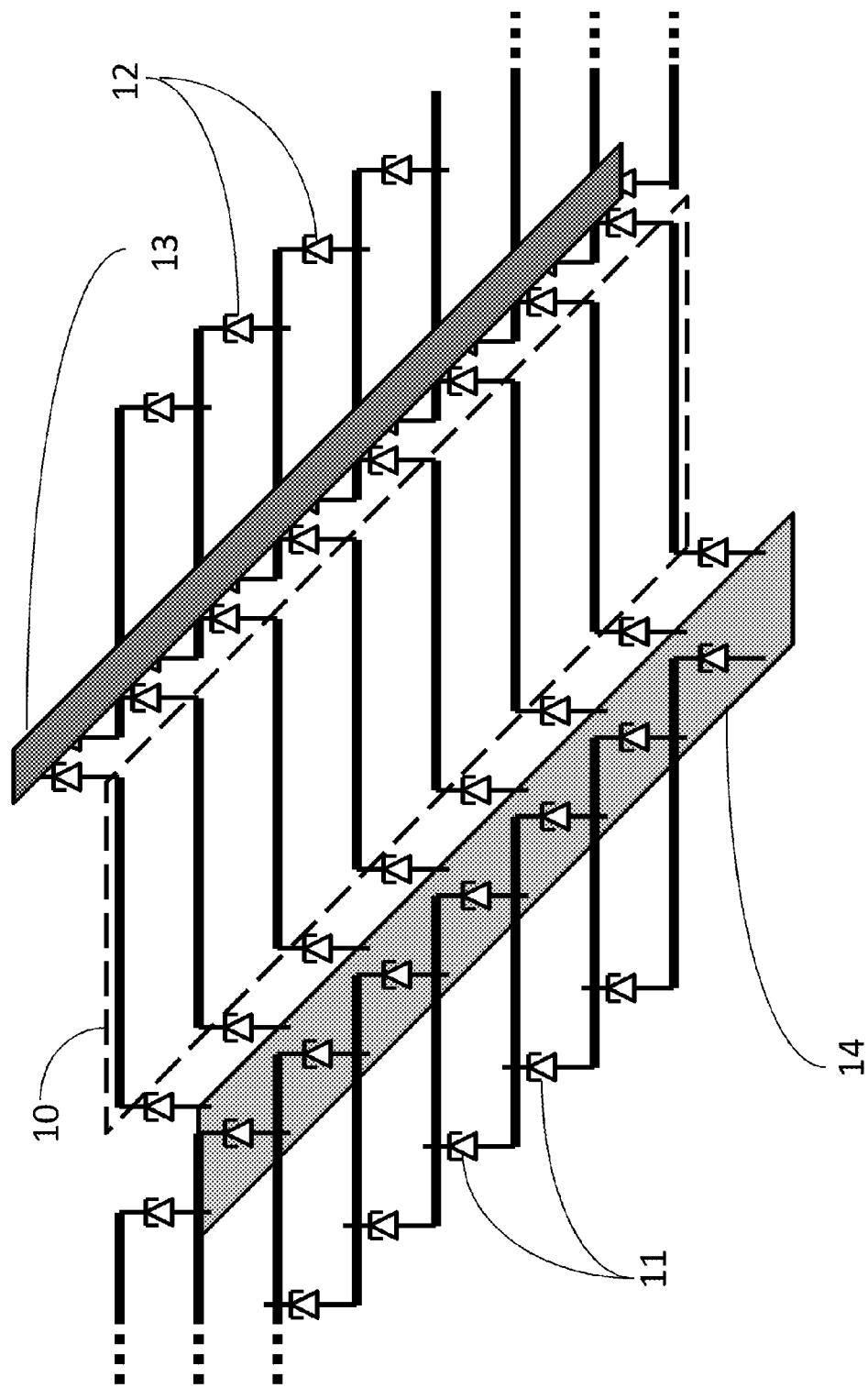
FIG. 1 is a logical diagram of an antenna array according to an embodiment of the invention.

A logical diagram of an embodiment of the present invention is shown in FIG. 1. The core of a solar antenna array may have rows of antennas 10, separated by power lines 13 and ground lines 14. The power and ground lines may be respectively coupled to the antennas by tunnel diodes 11 and 12. When the antennas are excited by visible light, the current may flow from the ground line to the power line, thus producing half-rectified electrical energy. It may be understood by one well-versed in the state of the art that additional circuitry, such as switching and decoupling capacitors, may be included in the periphery of the solar antenna array, as may be desired to produce stable DC power in voltages suited for commercial applications.

For antennas to efficiently receive visible light, it may be advantageous for them to be either ¼ or ½ of the wavelength of the light being captured, depending on whether or not the antenna is coupled to an existing ground plane. In order to produce such small structures, without expensive masking operations, one may create a stencil with which to manufacture the antennas.

Figure 4:
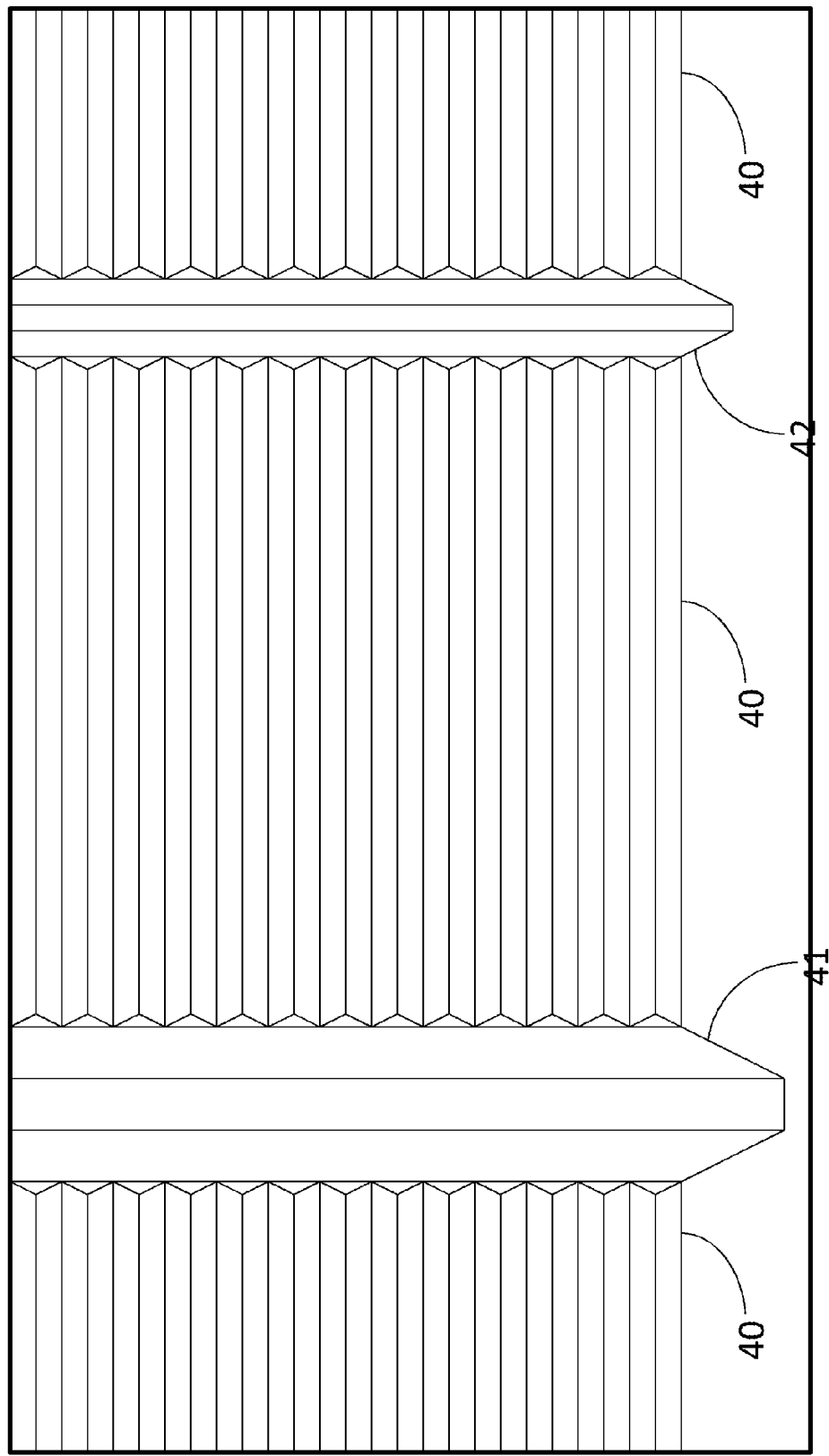
FIG. 4 is a diagram of a section of a stencil, according to an embodiment of the invention.

Reference is now made to FIG. 4, a top view of one embodiment of such a stencil. The stencil may have rows of horizontal v-shaped grooves 40, bounded on either side by one large v-shaped ridge 41 and one small v-shaped ridge 42. These ridges may alternate across the antenna array. The stencil may be formed out of a silicon wafer with crystal orientation (1,1,1), for ease in producing the V-shaped structures.

Reference is now made to FIGS. 2A, 2B and 2C, cross-sections in the Y direction of a first set of steps that may be used to produce a stencil. Initially the silicon wafer 21 of FIG. 2A may be patterned with near-minimum-dimension lines in positive resist, which may be vertically etched to produce a series of small trenches 23. These trenches may subsequently have a layer of etch stop material 22, such as Silicon Oxide or Silicon Nitride, deposited on them. A similar pattern in negative resist may be formed, where the similar pattern may consist of near-minimum-dimension lines, deposited with, again, a layer of etch stop 24, that may be equally spaced between the trenches 23.

In a next step, shown in FIG. 2B, the resist lines 24 and deposited material 22 may form etch stops for a V-groove etch, which may remove a portion of the silicon wafer 25, leaving the alternating large 26 and small 27 ridges. Subsequently in FIG. 2C, a thin layer of etch stop may be deposited over the entire array, which may adhere to non-(1,1,1) silicon surfaces. A subsequent vertical etch may be used to remove all the etch stop from the horizontal surfaces between the ridges 28, along with a thin layer of silicon 29, leaving a thin layer of the etch stop deposited on the large and small ridges 28. It should be noted that the combination of the alignment of the masking steps to create the trench 22 and the resist line pattern 24 in FIG. 2A, along with the duration of the V-groove etch 25 in FIG. 2B may be used to produce the proper antenna length 20, in FIG. 2C.

Figure 3A:
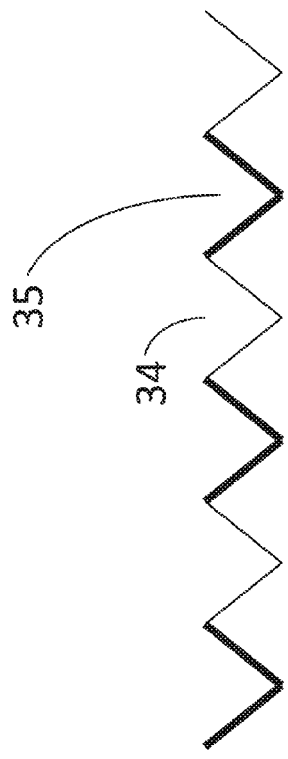
FIGS. 3A, 3B, 3C and 3D are cross-sections of a stencil in the X direction during its fabrication, according to an embodiment of the invention.
Figure 3C:
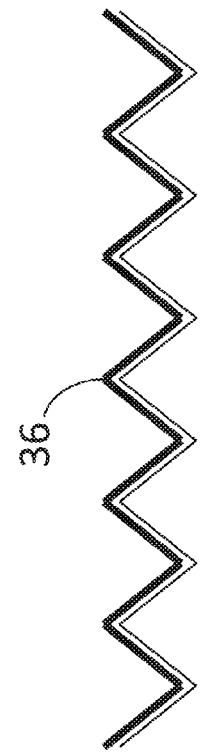
Figure 3B:
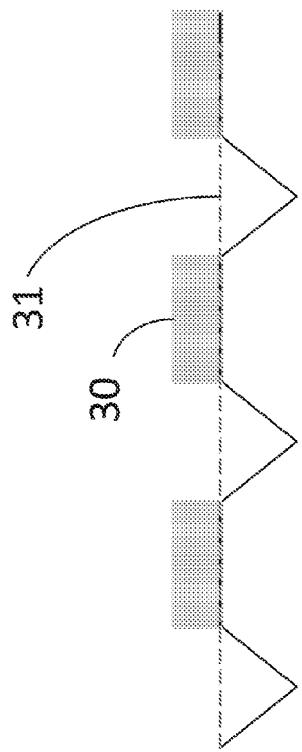
Figure 3D:
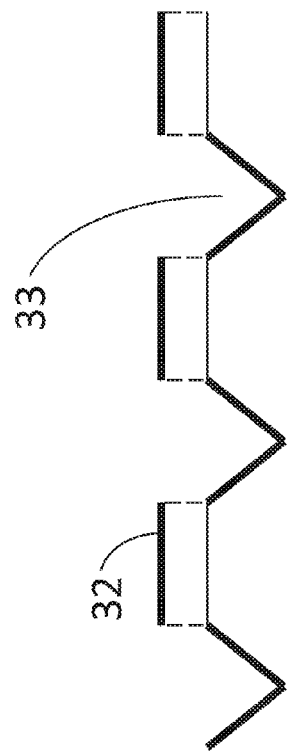

Reference is now made to FIGS. 3A, 3B, 3C and 3D, cross-sections in the X direction of a second set of steps that may be used to produce a stencil. In FIG. 3A, a regular array of equal-width lines 30 and spaces may be patterned on the flat silicon surface between the small and large v-shaped ridges (which, for example, may be prepared as discussed above). A subsequent partial V-groove etch may form partial V-grooves 31 between the resist lines 30. This may not be a time critical step if a (1,1,1) silicon material is used because the etch may preferentially select the (1,1,1) surface of the silicon, stopping when the groove is complete. Then a thin layer etch stop material may be deposited in the etched V-grooves 33, removing the rest by lifting it off with the resist used to pattern the V-grooves 32, as shown in FIG. 3B. Performing another V-group etch, using the material in the existing V-grooves 35 as an etch stop, may serve to etch out new V-grooves 34, as shown in FIG. 3C. The resulting pattern of grooves may then be cleaned of the etch stop material and may subsequently be covered with a layer of material, which is non-adhesive to the metal antenna, such as Silicon Nitride 36, shown in FIG. 3D.

The alignment of the lines 30 between the v-shaped ridges need not be exact, so long as they are large enough to extend onto but not over the v-shaped ridges, because the initial V-groove etch in FIG. 3C may not affect the material 28 on the small and large ridges, shown in FIG. 2C. While it may be desirable to keep the lines 30 and spaces 31, shown in FIG. 3A, to a minimum size, it may not be critical; rather, it may be more important to keep the widths of the lines 30 and spaces 31 as equal as possible, to keep the depths of the V-grooves as equal as possible. As such, in another embodiment, if the line pitch may be held to a tighter tolerance than the line widths and spaces, the V-groove etch in FIG. 3B may be followed by a resist removal and a continued V-groove etch, producing half as many V-grooves that are twice as deep. In this case, the trenches formed in the Y direction may be enlarged to ensure the proper fabrication of the solar antenna array.

Solar antenna array stencils may be created out of partial or full silicon wafers. It is further contemplated that silicon ingots may be grown with the necessary orientation to be sliced into long panels, or single crystal silicon annealing may be performed on long panels of silicon deposited glass or other suitable structure. It is further contemplated that the size of the stencil need only be determined by the ability to reliably use and reuse it in the manufacture of solar antenna arrays.

Figure 5C:
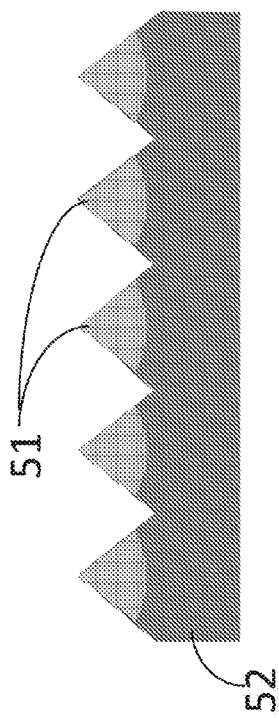
FIGS. 5A, 5B, 5C and 5D are cross-sections of an antenna array in the X direction during its fabrication, according to an embodiment of the invention.
Figure 5D:
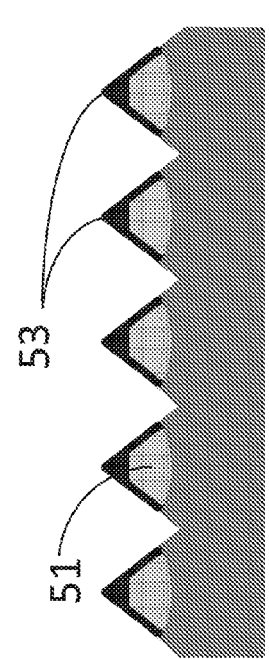
Figure 5A:
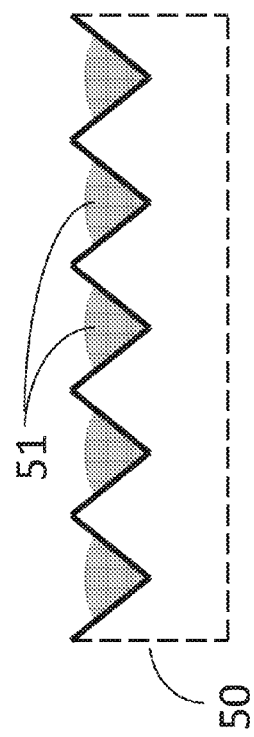
Figure 5B:
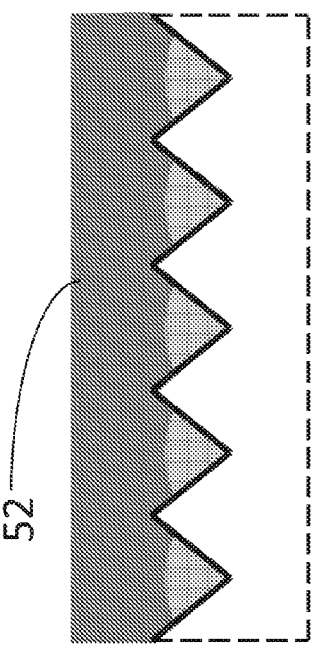

Reference is now made to FIGS. 5A,5B,5C, and 5D, X direction cross-sections of a first set of steps that may be used in the manufacture of solar antenna arrays, according to an embodiment of the invention. FIG. 5A shows the result of deposition of a suitable conductive material onto the V-grooves of a stencil 50, forming conductive lines 51, which may become the antennas. This may be accomplished by using, for example, low pressure chemical vapor deposition (LPCVD) equipment. In one embodiment, Nickel may be used because it does not adhere to the Silicon Nitride stencil. In order to create a Metal Oxide Metal (MOM) rectifying diode that can handle terahertz frequencies, the cross-section of the material 51 may be formed with a ¼ circle radius of less than 40 nm, but the V-groove size may be much larger because the amount of material is determined by the time of deposition, not the size of the V-groove. Forming a reasonable antenna array may require using a heated stencil, vibrating the stencil, or depositing the metal on a stencil angled at up to 45 degrees, or any combination of these processes. A layer of a polymer material 52, such as polyamide, may then be deposited on the stencil, as shown in FIG. 5B, and may then be cured sufficiently enough to enable peeling the polymer material 52 along with the conductive lines 51 off of the stencil, as shown in FIG. 5C. The peeling may be performed in the X direction, perpendicular to the antennas, to keep them from being broken by the peeling process. Then, a thin layer of oxide 53 may be grown on the conductive lines 51, as shown in FIG. 5D. The oxide layer may be less than 6 nm on the ends of the antennas.

Figure 6A:
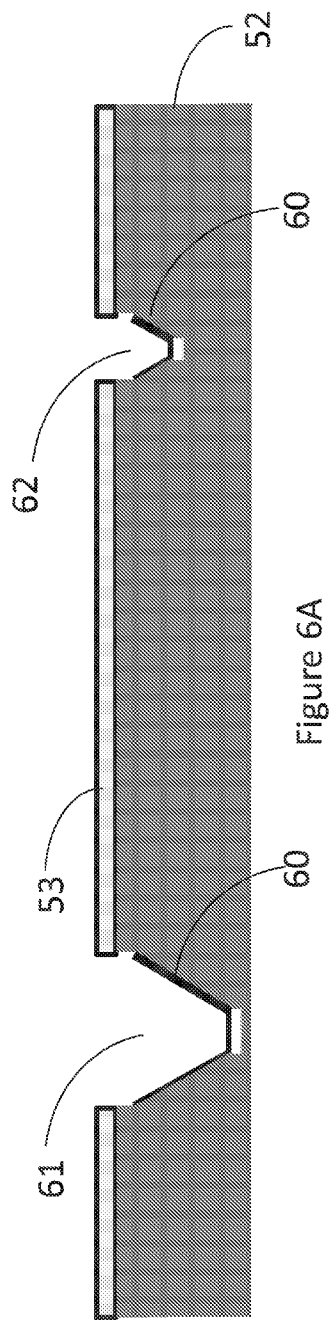
FIGS. 6A, 6B and 6C are cross-sections of an antenna array in the Y direction during its fabrication, according to an embodiment of the invention.
Figure 6B:
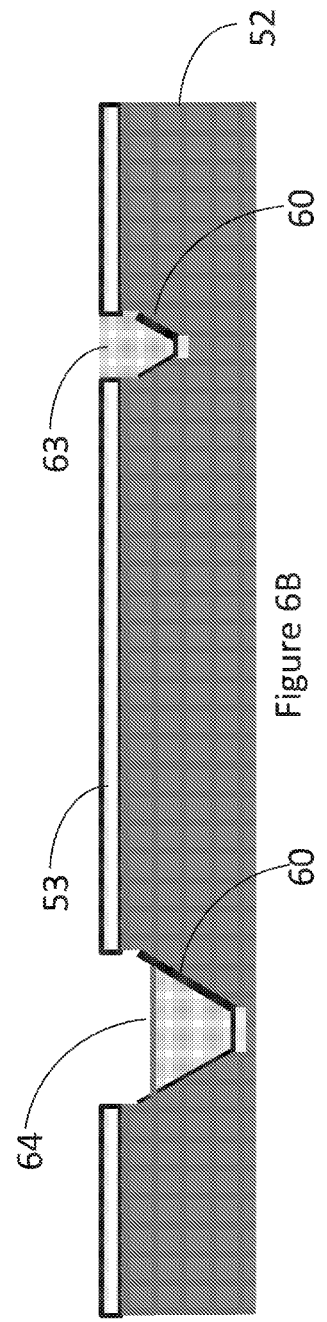
Figure 6C:
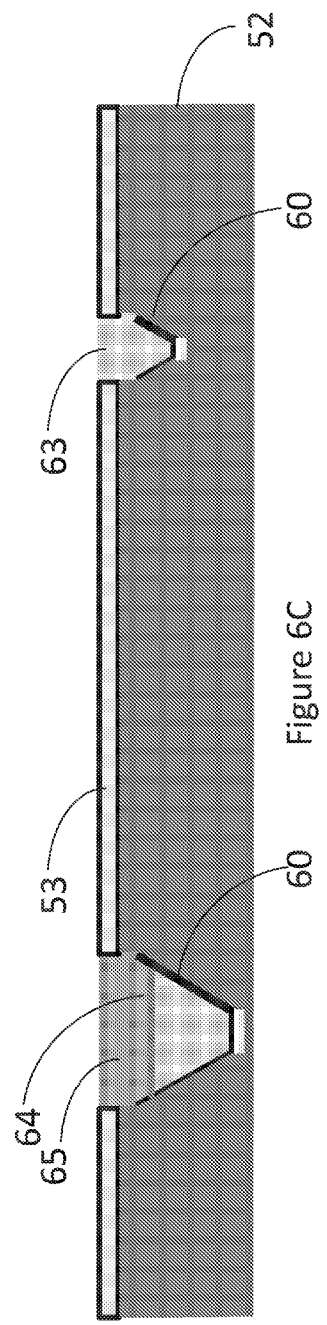

Reference is now made to FIGS. 6A, 6B, and 6C, Y direction cross-sections of a second set of steps that may be used in the manufacture of Solar antenna arrays. As shown in FIG. 6A, when peeled off the stencil, the polymer material 52 may have large 61 and small 62 depressions from the large 41 and small 42 v-shaped ridges on the stencil as seen in FIG. 4. To keep the antennas 53 insulated from subsequent metal depositions, a thin cover glass layer 60 may then be deposited on the antenna array. In one embodiment, a short etch may be added to ensure the oxide on the ends of the antennas 53 are exposed. Next, as seen in FIG. 6B, the power line material 63 may be deposited and polished to remove the rextranious material from the antenna array leaving distinct power lines, as shown in FIG. 6B. A sufficient amount of material may be deposited to fill the small depression 62, but only partially fill the large depression 61. In another embodiment, a thin layer of non-adhesive material 64 may be deposited/grown on the deposited material to allow for easy removal of the polishing debris, and another short etch may be added following polishing, to again ensure the oxide on the ends of the antennas 53 is exposed. As shown in FIG. 6C, the ground line material 65 may be deposited and polished off of portions of the array to form the ground lines in a manner similar to the process for the power lines, as shown in FIG. 6d. In another embodiment, the power and ground line materials may be malleable metals, such as Aluminum and Gold respectively.

In yet another embodiment of the fabrication process, the stencil may be cleaned, repaired as necessary, and reused for producing a plurality of antenna arrays.

It should be noted that the design of the stencil and associated antenna array process may be optimized to minimize the overall cost of the fabrication process by minimizing the cost of both the stencil and antenna array processes while maximizing the stencil reuse and antenna array yield.

In yet another embodiment of the stencil construction and antenna array process, most of the antenna array may be constructed on the stencil, and only polishing and applying a protective layer to the antenna array may then be performed after removing it from the stencil.

Reference is now made to FIGS. 12A, B and C, Y direction cross-sections of a stencil during its fabrication, according to an embodiment of the invention. In this case, as shown in FIG. 12B, vertical sided v-grooves 123 may be etched by resist 120 masking, first a vertical etch for the power 122 and ground 121 lines, as shown in FIG. 12A, and then a V-groove etch 123, as shown in FIG. 12B. The resist may then be refilled into the V-groove trenches, 125 and polished off to expose the silicon 124, as shown in FIG. 12C. The resist may serve as an etch stop for the subsequent X direction etches.

Reference is now made to FIGS. 13A, B, C and D, cross-sections of a stencil in the X direction during its fabrication, according to an embodiment of the invention. A masked resist pattern 130 may be formed formed, which may be followed by a V-groove etch, as shown in FIG. 13A. Resist may then be reapplied and polished off, leaving resist in the existing V-grooves 132, and another V-groove etch may be performed, creating another set of V-grooves 133, as shown in FIG. 13B. The resist may then be removed, as shown in FIG. 13C, and a thin layer of non-adhesion material 134 may be applied to the stencil, as shown in FIG. 13D. Unlike the prior X direction V-groove process, as shown in FIGS. 3A, B, C and D, the current process need not require deposition of an etch stop or its subsequent lift off.

Figure 14:
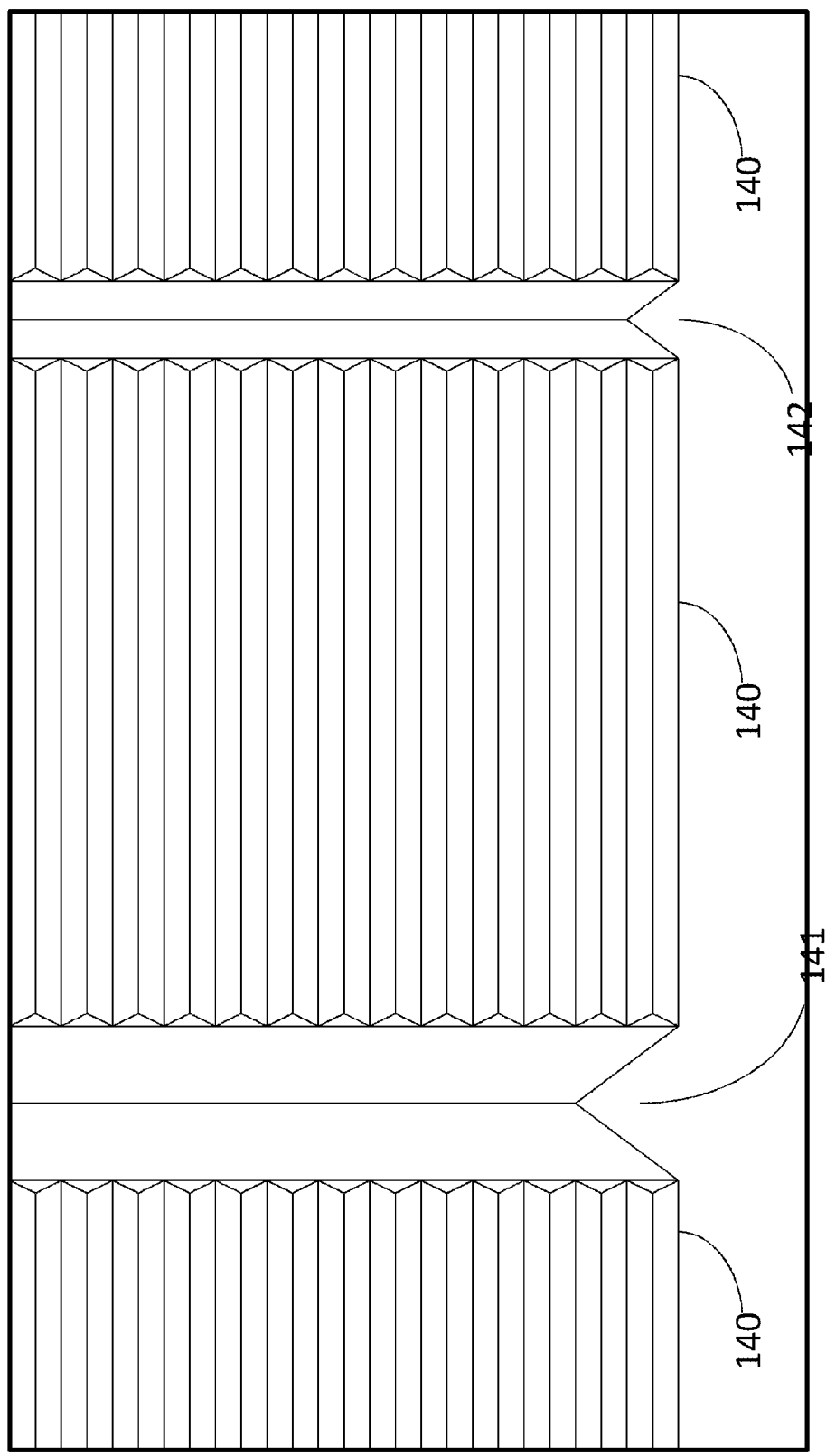
FIG. 14 is top cut away view of a section of a stencil, according to an embodiment of the invention.

Reference is now made to FIG. 14, a top cut away view of a section of a stencil, according to an embodiment of the invention. In this case, while the antenna X direction V-grooves 140 may be substantially the same as those 40 shown in FIG. 4, the V-groove trenches 141 and 142 may be inverted compared to the V-shaped ridges 41 and 42 shown in FIG. 4. This may serve to facilitate the deposition of the power and ground lines on the stencil, prior to removing the finished antenna array from the stencil.

Figure 15A:
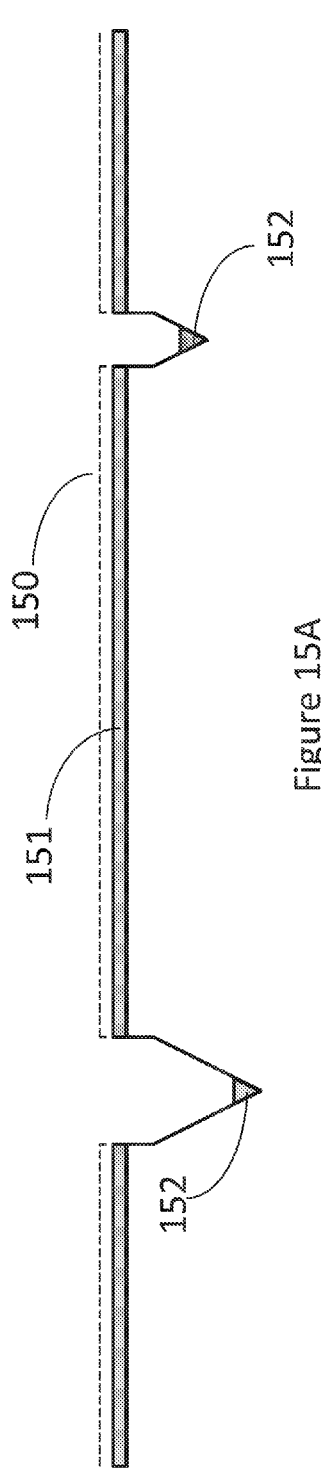
Figure 15B:
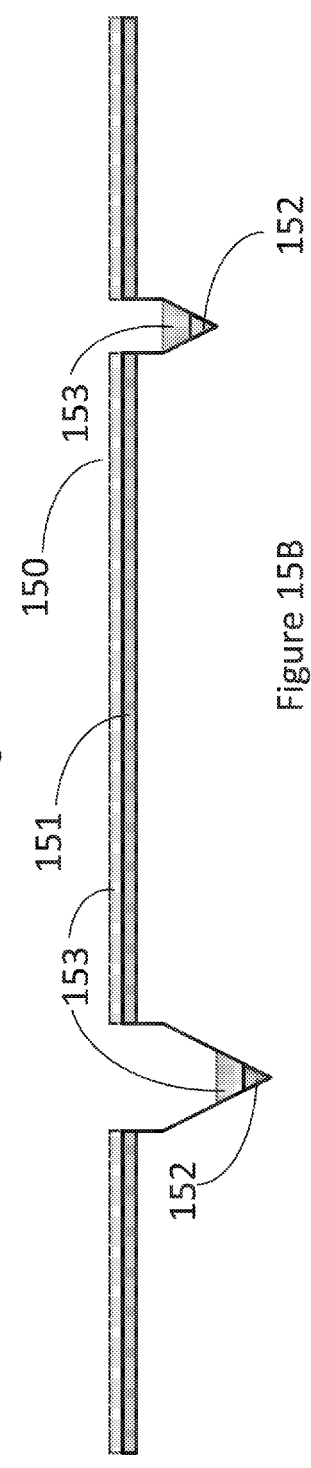
Figure 15C:
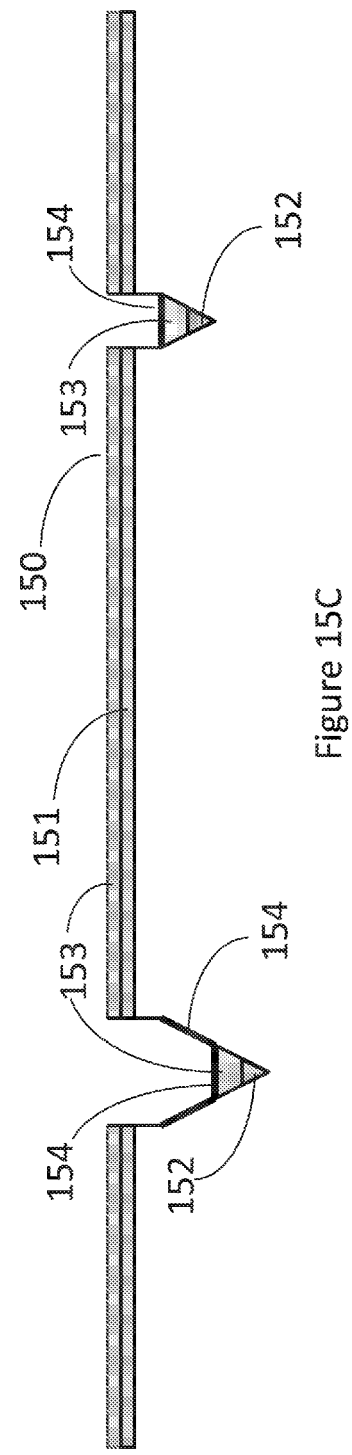

Reference is now made to FIGS. 15A through F, cross-sections of an antenna array during fabrication on the stencil, according to an embodiment of the invention. Initially, as shown in FIG. 15A, a suitable conductive material, such as Nickel, may be deposited onto the stencil to form the antenna 151, including the bottom of the trenches 152, which may be followed by a thin oxide step. Next, as shown in FIG. 15B, cover glass may be deposited 153, which may be at least to the top of the X-direction V-grooves 150. In one embodiment, a short etch may be added to ensure the oxide on the ends of the antennas 151 is exposed. Ideally the glass and conductive layer below it may be chosen to not adhere to the non-adhesion layer, 134, as shown in FIG. 13D, on the stencil. Optionally, if the conductive materials for the power and ground lines are not easily removed from the existing non-adhesion layer, in the next step, a thin layer of another non-adhesion material 154 may be deposited, as shown in FIG. 15C. Then, in the same manner as the process shown in FIGS. 6A, b and c, The conductive material for the power lines 155 shown in FIG. 15D and the ground lines 156 shown in FIG. 15E may be respectively deposited and polished off (as needed). Then, a flexible polymer 157, shown in FIG. 15F, may be deposited to form a backing for peeling the antenna array off of the stencil.

Reference is now made to FIG. 16A, a cross-section of an antenna array, peeled from the stencil and flipped over, with an added cover glass layer 160, according to an embodiment of the invention. Optionally, this thick cover glass 160 may be polished to remove the unnecessary layers down to the power 162 and ground 161 conductive materials, as shown in FIG. 16B, and an additional passivation material 163 may be added to cover the exposed conductive materials, as shown in FIG. 16C. It should be noted that the same materials and steps as described in the first process may be used in this fabrication process, and other fabrication steps may be added, or the steps described herein may be modified as necessary to improve the yield of the antenna arrays, or preservation of the stencils.

Figure 7:
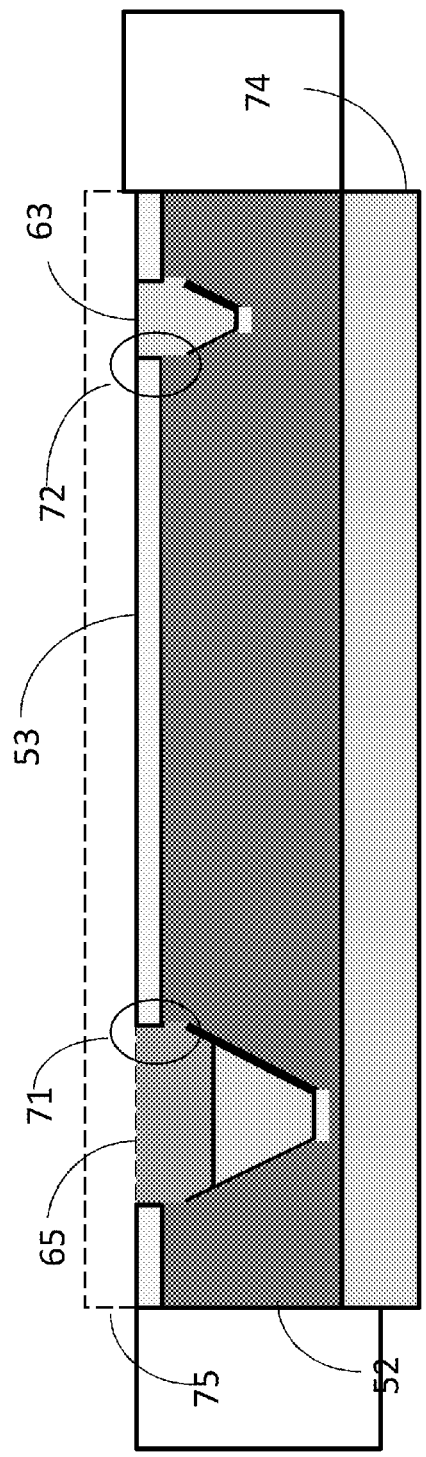
FIG. 7 is a cross-section of a section of an antenna array, according to an embodiment of the invention.

Reference is now made to FIG. 7, a Y cross-section of a finished Solar antenna array, according to an embodiment of the invention. In this case, a clear cover layer 75 may be added to protect the array, and a solid back plate 74 may be attached to the polymer material 52 to make the structure more rigid. A MOM diode 71 may exist between the antenna 53 and the ground line 65, and another MOM diode 72 may exist between the antenna 53 and the power line 63, because of the oxide that was grown on the antennas. In another embodiment, the back plate 74 may be a mirror for reflecting light not absorbed by the antenna array. In yet another embodiment, the back plate 74 may be a conductive ground plane, and the polymer material 52 thickness may be adjusted for so that the antenna array may function as an optimal stripline antenna array.

Figure 8:
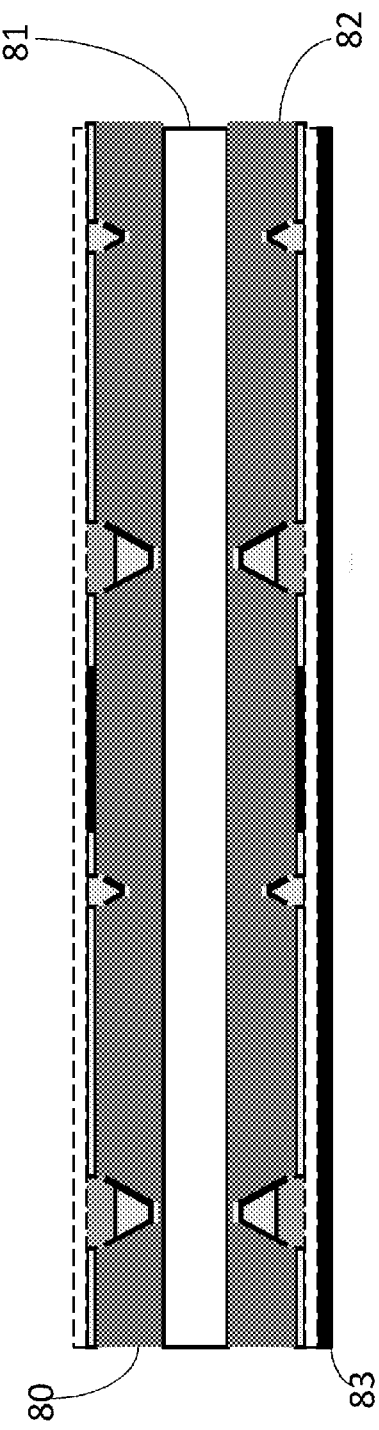
FIG. 8 is a cross-section of two antenna arrays sandwiched together, according to an embodiment of the invention.

Reference is now made to FIG. 8, which reflects a further embodiment of the invention. A solar antenna array 80 may optimally absorb light polarized in the direction of the antennas (e.g., the Y direction), which is generally only ½ of the energy in sunlight. Other components, e.g., the X components, of the randomly polarized light from the sun may propagate through or reflect off the solar antenna array. Therefore, in another embodiment, two such solar antenna arrays, 80 and 82, may be sandwiched together with a light rotating material 81, such as liquid crystal between them. Furthermore, a layer of reflecting material 83 may be attached to the back side of the structure to reflect remaining light back into the sandwiched array. It is further contemplated that the polymer material 52 and conductive ground back plate 74 as shown in FIG. 7 may be optically transparent and may be included in such a sandwiched structure.

Figure 10:
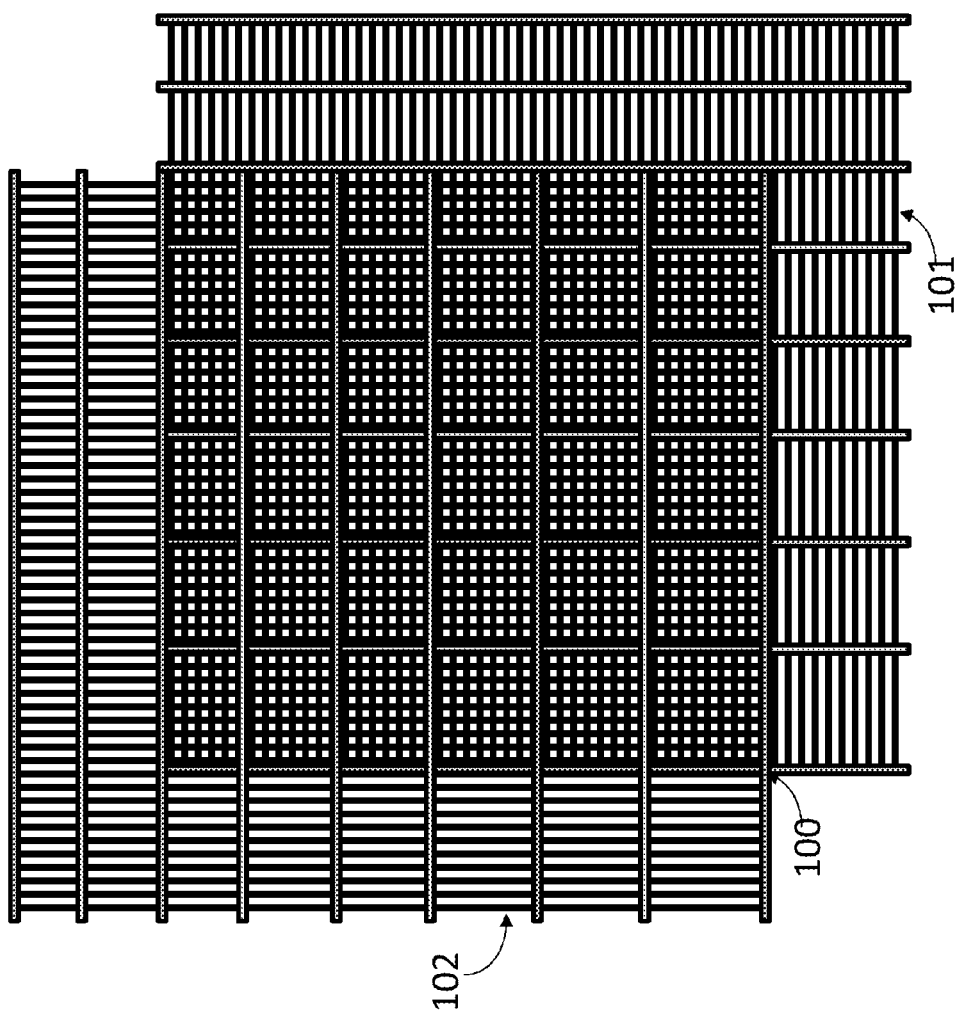
FIG. 10 is a top view of two antenna arrays sandwiched together, according to an embodiment of the invention.

In yet another embodiment of the present invention, the material 81 may be optically clear, and the two solar antenna arrays 101 and 102, as shown in FIG. 10, may be sandwiched perpendicular to each other, as can be seen in the overlapping section 100.

Figure 9:
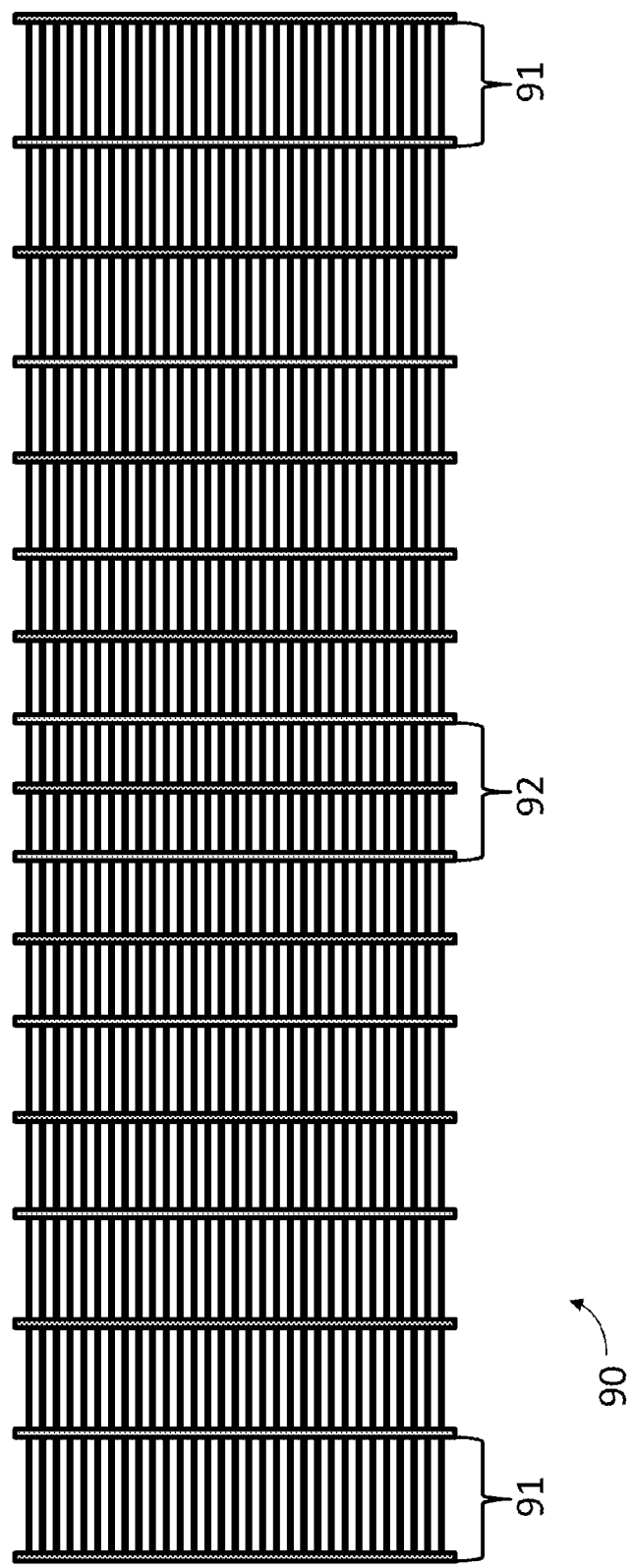
FIG. 9 is a top view of a section of an antenna array, according to an embodiment of the invention.

Reference is now made to FIG. 9, a top view of a section of a solar antenna array, according to an embodiment of the invention. While the highest energy in visible light may generally be in the blue-green section of the spectrum (around 500 nm wavelength), it may be desirable to absorb as much of the visible spectrum as possible. It may, therefore, be desirable to vary the antenna length to cover most of the visible spectrum, e.g., from 400 nm to 720 nm. This may be accomplished by varying the sizes of respective rows of antennas back and forth across the array, from two ¼-wavelength sections of 100 nm each 92 up to two ¼-wavelength sections of 180 nm, or twice those dimensions if ground planes are not added to the array. The diagram 90 in FIG. 9 may be used to cover the spectrum from 400 nm to 720 nm in eight equal steps.

It will be appreciated by persons skilled in the art that the dimensions described in this invention may be difficult to fabricate, and may be prone to defects, particularly open circuits ("opens") and/or short circuits ("shorts") between the antenna and the power or ground lines.

Reference is now made to FIG. 11A, a diagram of a section of an antenna array according to an embodiment of the invention, where the antenna array is shown with defective diodes, depicted as resistors, connecting random antenna to power 112, or ground 113. In some cases, an antenna 111 may have two shorted diodes. Such defects may create shorts or partial shorts between the power and ground lines.

In another embodiment, the antenna arrays may be tested and fixed by applying a voltage between the ground and power lines sufficient to force a single tunnel diode past its negative resistance, but not sufficient to turn on good pairs of diodes. This may selectively drive current through the shorted defective diodes and may thereby heat the resistors sufficiently to open the short in a manner similar to a fuse, which may result in eliminating the shorts between power and ground, Reference is now made to FIG. 11B, a diagram of a section of the antenna array, according to an embodiment of the invention, where the antenna array is shown with defective diodes, which have been blown, and which are depicted as open capacitors, connecting random antenna elements to power 112 or ground 113. In an antenna with two shorted diodes 114, the weakest one of the resistors may blow, thereby eliminating the short.

In yet another embodiment, the antenna elements may be spaced close enough together to minimize the degradation of power production by the array due to the elimination of a random defective antenna.

It will be appreciated by persons skilled in the art that the present invention is not limited by what has been particularly shown and described hereinabove. Rather the scope of the present invention includes both combinations and subcombinations of various features described hereinabove as well as modifications and variations which would occur to persons skilled in the art upon reading the foregoing description and which are not in the prior art.

I claim:

1. A solar antenna array configured to convert sunlight into electrical power of the array comprising:
   alternating substantially parallel power and ground lines oriented in a first direction;
   rows of substantially parallel antennas, oriented in a second direction perpendicular to the first direction, wherein ends of the antennas are aligned to the power and ground lines; and
   two types of metal-oxide-metal (MOM) diodes, wherein the two respective types of MOM diodes are distinguished from each other by being composed of at least one material that is different in the two respective types of MOM diodes, wherein respective ones of a first type of the two types of MOM diodes are configured to connect respective ends of respective ones of the antennas to the power lines and respective ones of a second type of the two types of MOM diodes are configured to connect respective ends of respective ones of the antennas to the ground lines,
   wherein the MOM diodes are coplanar with the antennas, the power lines and the ground lines, in a plane formed by the first direction and the second direction, and
   wherein each of the power lines has a different width from each of the ground lines.

2. The solar antenna array as in claim 1, wherein the rows of substantially parallel antennas include antennas of different lengths.

3. The solar antenna array as in claim 2, wherein the antennas of different lengths are configured to cover at least two regions of the visible light spectrum.

4. The solar antenna array as in claim 1, further comprising:
   a polymer material; and
   a back plate,
   wherein the back plate is configured to form a conductive ground plane, wherein the polymer material is configured to form an insulating layer with a dielectric constant and thickness such that the rows of substantially parallel antennas form strip-line antennas for a portion of the visible light spectrum.

5. The solar antenna array as in claim 1, further comprising:
   an optically transparent polymer material; and
   a reflective back plate,
   wherein the reflective back plate and the optically transparent polymer material are arranged such that the rows of substantially parallel antennas are enabled to absorb both incident light and light reflected from the reflective back plate.

6. The solar antenna array as in claim 1, wherein material for the antennas comprises nickel.

7. The solar antenna array as in claim 1 wherein material for the power lines comprises aluminum.

8. The solar antenna array as in claim 1, wherein material for the ground lines comprises gold.

9. The solar antenna array as in claim 1, wherein the plane is defined by the power and ground lines and by the antennas.

10. The solar antenna array as in claim 1, wherein the first type of MOM diode comprises nickel, nickel oxide, and aluminum as a first metal, an oxide, and a second metal, respectively, forming a MOM diode of the first type.

11. The solar antenna array as in claim 10, wherein the nickel corresponds to a material of the antennas and the aluminum corresponds to a material of the power lines.

12. The solar antenna array as in claim 1, wherein the second type of MOM diode comprises nickel, nickel oxide, and gold as a first metal, an oxide, and a second metal, respectively, forming a MOM diode of the second type.

13. The solar antenna array as in claim 12, wherein the nickel corresponds to a material of the antennas and the gold corresponds to a material of the ground lines.

14. The solar antenna array as in claim 1, wherein the antennas are configured on and non-adherently removed from a stencil.

* * * * *